United States Patent
Hiester et al.

(10) Patent No.: US 11,239,100 B2
(45) Date of Patent: Feb. 1, 2022

(54) AUTO-CALIBRATION TO A STATION OF A PROCESS MODULE THAT SPINS A WAFER

(71) Applicant: Lam Research Corporation, Fremont, CA (US)

(72) Inventors: Jacob L. Hiester, Beaverton, OR (US); Richard Blank, Fremont, CA (US); Peter Thaulad, Fremont, CA (US); Paul Konkola, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 77 days.

(21) Appl. No.: 16/870,847

(22) Filed: May 8, 2020

(65) Prior Publication Data
US 2020/0273731 A1 Aug. 27, 2020

Related U.S. Application Data

(63) Continuation of application No. 16/000,734, filed on Jun. 5, 2018, now Pat. No. 10,651,065.
(Continued)

(51) Int. Cl.
*H01L 21/67* (2006.01)
*H01L 21/687* (2006.01)
(Continued)

(52) U.S. Cl.
CPC .. *H01L 21/67259* (2013.01); *H01J 37/32724* (2013.01); *H01L 21/67161* (2013.01);
(Continued)

(58) Field of Classification Search
CPC ......... H01L 21/67259; H01L 21/68771; H01L 21/67748; H01L 21/67253; H01L 21/681; H01L 21/67201; H01L 21/68764; H01L 21/68; H01L 21/67742; H01L 21/67161; H01L 22/20; H01L 21/67248; H01L 21/68742; H01L 21/6831; H01L 21/67098; H01J 37/32724; H01J 2237/334; H01J 2237/2446; H01J 2237/24578; H01J 2237/3321
See application file for complete search history.

(56) References Cited

U.S. PATENT DOCUMENTS 6,836,690 B1   12/2004   Spady et al.
9,196,518 B1 * 11/2015   Hofmeister ........... H01L 21/677
(Continued)

OTHER PUBLICATIONS

Intl. Prelim Report & Written Opinion, PCT/US2018/059704, dated Jun. 9, 2020, 7 pages.

*Primary Examiner* — Karen Kusumakar
*Assistant Examiner* — Adam S Bowen
(74) *Attorney, Agent, or Firm* — Penilla IP, APC

(57) ABSTRACT

A method for calibration including determining a temperature induced offset in a pedestal of a process module under a temperature condition for a process. The method includes delivering a wafer to the pedestal of the process module by a robot, and detecting an entry offset. The method includes rotating the wafer over the pedestal by an angle. The method includes removing the wafer from the pedestal by the robot and measuring an exit offset. The method includes determining a magnitude and direction of the temperature induced offset using the entry offset and exit offset.

20 Claims, 12 Drawing Sheets

Related U.S. Application Data

(60) Provisional application No. 62/595,454, filed on Dec. 6, 2017.

(51) Int. Cl.
    *H01L 21/68*     (2006.01)
    *H01L 21/677*     (2006.01)
    *H01J 37/32*     (2006.01)
    *H01L 21/66*     (2006.01)
    *H01L 21/683*     (2006.01)

(52) U.S. Cl.
    CPC .. *H01L 21/67201* (2013.01); *H01L 21/67248* (2013.01); *H01L 21/67253* (2013.01); *H01L 21/67742* (2013.01); *H01L 21/67748* (2013.01); *H01L 21/68* (2013.01); *H01L 21/681* (2013.01); *H01L 21/68742* (2013.01); *H01L 21/68764* (2013.01); *H01L 21/68771* (2013.01); *H01L 22/20* (2013.01); *H01J 2237/2446* (2013.01); *H01J 2237/24578* (2013.01); *H01J 2237/334* (2013.01); *H01J 2237/3321* (2013.01); *H01L 21/6831* (2013.01)

(56) References Cited

U.S. PATENT DOCUMENTS

| | | | |
|---|---|---|---|
| 10,312,120 B2* | 6/2019 | Ravid | C23C 16/4584 |
| 2007/0071581 A1 | 3/2007 | Gilchrist et al. | |
| 2010/0012855 A1* | 1/2010 | Lazarov | G01N 21/9501 |
| | | | 250/491.1 |
| 2012/0224945 A1* | 9/2012 | Douki | H01L 21/68 |
| | | | 414/758 |
| 2015/0340225 A1* | 11/2015 | Kim | C23C 16/44 |
| | | | 438/694 |
| 2015/0369583 A1* | 12/2015 | Potter, Sr. | H01L 21/681 |
| | | | 702/150 |
| 2016/0322215 A1* | 11/2016 | Shaikh | H01J 37/32935 |
| 2016/0345384 A1* | 11/2016 | Zhang | H01L 22/20 |

* cited by examiner

|  | X | Y |
|---|---|---|
| Measured AWC value (inbound) Variable Inputs: $X_1, Y_1$ | 235 | -549 |
| Wafer Offset, On TwistPad $X_{p1}, Y_{p1}$ | 200 | 100 |
| Wafer Offset, On TwistPad, rotated $X_{p2}, Y_{p2}$ | -200 | -100 |
| Measured AWC value (outbound) Measured Output: $X_2, Y_2$ | -165 | -749 |
| Correction: $X_F, Y_F$ | | |
| Correction Vector | -200 | -100 |

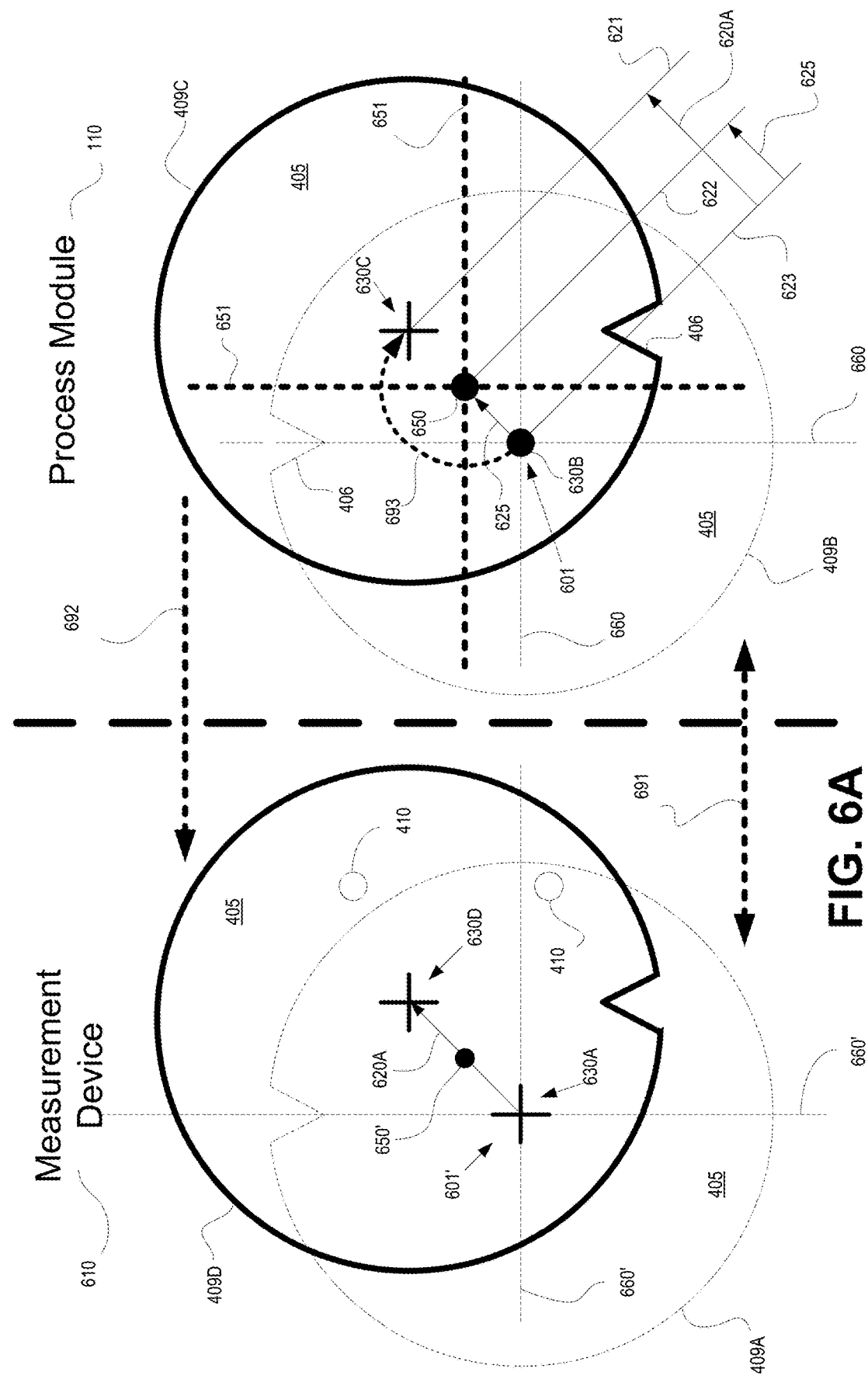

AUTO-CALIBRATION TO A STATION OF A PROCESS MODULE THAT SPINS A WAFER

CLAIM OF PRIORITY

This application is a continuation of and claims priority to and the benefit of commonly owned U.S. patent application Ser. No. 16/000,734, filed on Jun. 5, 2018, entitled "AUTO-CALIBRATION TO A STATION OF A PROCESS MODULE THAT SPINS A WAFER". which claims priority to and the benefit of the commonly owned, provisional patent application, U.S. Ser. No. 62/595,454, filed on Dec. 6, 2017, entitled "AUTO-CALIBRATION TO A STATION OF A PROCESS MODULE THAT SPINS A WAFER," all of which are herein incorporated by reference in their entireties for all purposes.

CROSS-REFERENCE TO RELATED APPLICATIONS

This application is related to U.S. patent application Ser. No. 15/291,549, entitled "WAFER POSITIONING PEDESTAL FOR SEMICONDUCTOR PROCESSING," filed on Oct. 12, 2016.

TECHNICAL FIELD

The present embodiments relate to robots, and more particularly to robots employed in wafer processing systems.

BACKGROUND OF THE DISCLOSURE

In semiconductor processing systems, robots are employed to move wafers from one location to another. For example, one or more robots may be employed to pick up a wafer from a wafer cassette in a loading port, move the wafer to a load lock, move the wafer to one or more intermediate locations (e.g., transfer modules), and move the wafer to a process module or reactor for wafer processing.

To accurately place and pick up wafers, a robot needs to know the coordinates of various locations in the wafer processing system. Coordinates may be programmed into a respective robot during a set-up process after it is installed in the wafer processing system. In that manner, hand-off (e.g., pick and place) locations used by the robot are known. For example, a robot may be used to transfer wafers from a transfer module into a process module, such as to a pedestal center. Typically, the set-up process is performed by a technician or a field service engineer while the process module is cold. However, once the process module is under vacuum or raised to a higher temperature, coordinates of a specific location (e.g., center of a pedestal) within the process module may have moved. Accurate placement of a wafer to a specific location during process conditions is desired to decrease errors incurred during the processing of the wafer, and to achieve smaller form factors for semiconductor devices and/or integrated circuits.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

It is in this context that disclosures arise.

SUMMARY

The present embodiments relate to solving one or more problems found in the related art, and specifically to measure the offset of a specific location, such as a location tied to a device, within a process module that is under condition.

Embodiments of the present disclosure include a method for calibration to include determining a temperature induced offset in a pedestal of a process module under a temperature condition for a process. The method includes delivering a wafer to the pedestal of the process module by a robot, and detecting an entry offset. The method includes rotating the wafer over the pedestal by an angle. The method includes removing the wafer from the pedestal by the robot and measuring an exit offset. The method includes determining a magnitude and direction of the temperature induced offset using the entry offset and exit offset.

Embodiments of the disclosure include a method for calibration. The method includes establishing a reference coordinate system based on an initial calibrated location of a rotation axis of a rotation device within a process module. The method includes applying a condition to the process module. The method includes picking up a calibration wafer from an inbound load lock using a transfer module (TM) robot configured to transfer the calibration wafer to the process module. The method includes determining a first measurement of the calibration wafer within the reference coordinate system using a measurement device when transferring the calibration wafer to the process module, the measurement device fixed within the reference coordinate system. The method includes handing off the calibration wafer to the process module using the TM robot. The method includes interfacing the calibration wafer with the rotation device. The method includes rotating the calibration wafer by an angle using the rotation device. The method includes removing the calibration wafer from the process module using the TM robot. The method includes determining a second measurement of the calibration wafer within the reference coordinate system using the measurement device when transferring the calibration wafer to an outbound load lock. The method includes determining a condition correction of the rotation axis based on the first measurement and the second measurement, the condition correction corresponding to the offset of the rotation axis from the initial calibrated location when the process module is under the condition.

Embodiments of the disclosure include another method for calibration. The method includes establishing a reference coordinate system based on an initial calibrated location of a rotation axis of a rotation device within a process module. The method includes establishing a calibrated reference measurement of a calibration wafer within the reference coordinate system using a measurement device fixed within the reference coordinate system when transferring the calibration wafer from the process module from the initial calibrated location using a transfer module (TM) robot. The calibration wafer placed to be centered about the rotation axis, such that the calibrated reference measurement is aligned with the initial calibrated location of the rotation axis. The method includes determining a condition correction of the rotation axis corresponding to an offset of the rotation axis from the initial calibrated location when the process module is under a condition based on a rotation of the calibration wafer by an angle about the rotation axis using the rotation device within the process module. The method includes picking up a process wafer from an inbound load lock using the TM robot. The method includes determining an alignment measurement of the process wafer within the reference coordinate system using the measurement device when transferring the process wafer to the process module. The method includes determining an alignment correction of a process wafer corresponding to an offset of the process wafer from the calibrated reference measurement based on the alignment measurement. The method includes applying the condition correction to the process wafer using the TM robot. The method includes applying the alignment correction using the TM robot to align the process wafer to the rotation axis that is offset from the initial calibrated location.

Embodiments of the disclosure include a system for processing wafers. The system includes a process module including a rotation device having a rotation axis. The system includes a reference coordinate system based on an initial calibrated location of the rotation axis of the rotation device. The system includes a transfer module (TM) robot configured for transferring wafers to and from the process module. The system includes a measurement device fixed within the reference coordinate system, the measurement device intercepting wafers transferred to and from the process module. The system includes a processor and memory coupled to the processor and having stored therein instructions that, if executed by the processor, cause the processor to execute a method for calibration comprising. The method includes establishing a reference coordinate system based on an initial calibrated location of a rotation axis of a rotation device within the process module. The method includes applying a condition to the process module. The method includes picking up a calibration wafer from an inbound load lock using the TM robot configured to transfer the calibration wafer to the process module. The method includes determining a first measurement of the calibration wafer within the reference coordinate system using a measurement device when transferring the calibration wafer to the process module, the measurement device fixed within the reference coordinate system. The method includes handing off the calibration wafer to the process module. The method includes interfacing the calibration wafer with the rotation device. The method includes rotating the calibration wafer by an angle using the rotation device. The method includes removing the calibration wafer from the process module using the TM robot. The method includes determining a second measurement of the calibration wafer within the reference coordinate system using the measurement device when transferring the calibration wafer to an outbound load lock. The method includes determining a condition correction of the rotation axis based on the first measurement and the second measurement, the condition correction corresponding to the offset of the rotation axis from the initial calibrated location when the process module is under the condition.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 6A is a diagram illustrating the calibrated reference measurement of a calibration wafer that is aligned with the initial location of a rotation axis of a rotation device within a process module, and the effect that an offset of a rotation axis of a rotation device within a process module has on the calibration wafer when the calibration wafer is rotated, in accordance with one embodiment of the present disclosure.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for correction of an offset of a rotation axis of a rotation device (e.g., rotating pedestal) within a process module. In that manner, embodiments of the present disclosure are capable of reducing errors caused by misalignment of an incoming wafer that is delivered to a calibrated location (e.g., rotation axis) within a process module that has moved after a process condition has been placed on the process module. By correcting for this condition offset, the form factor of the semiconductor devices and integrated circuits including the semiconductor devices can be reduced.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Embodiments of the present disclosure relate to methods and apparatuses for performing calibration of robots and/or tool systems coupled to a plasma process modules, such as those used in atomic layer deposition (ALD) and plasma enhanced chemical vapor deposition (PECVD) processes. Embodiments of the present disclosure may be implemented in various process module configurations. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.). Examples of plasma processing systems and plasma process modules are disclosed in commonly owned U.S. Pat. Nos. 8,862,855, and 8,847,495, and 8,485,128, and U.S. patent application Ser. No. 15/369,110.

Figure 1:
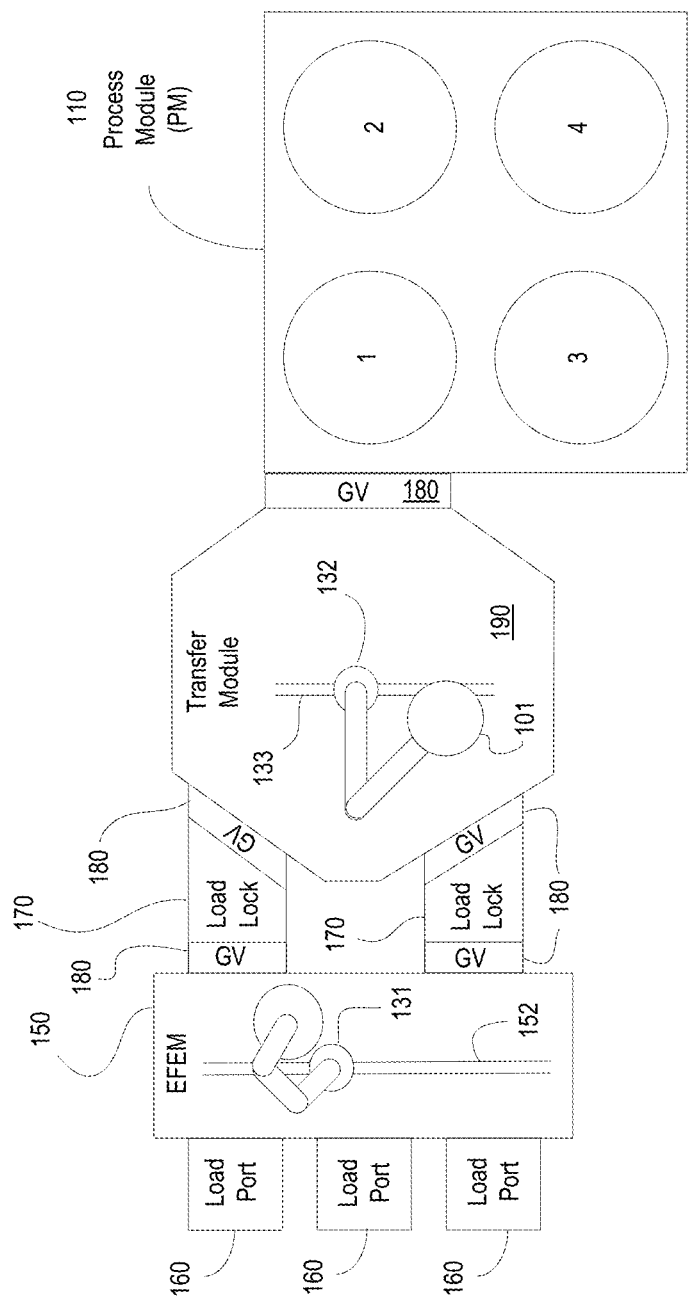
FIG. 1 illustrates a substrate processing system, which is used to process a wafer, e.g., to form films thereon.

FIG. 1 illustrates a plasma processing system 100, which is used to process a wafer, e.g., to form films over substrates, such as those formed in ALD and PECVD processes. System 100 is configured to process wafers to produce semiconductor devices, for example. Front opening unified pods (FOUPs) (not shown) are configured for holding one or more wafers and for moving wafers into, within, and out of system 100. FOUPS may interface with load port(s) 160 for delivery of wafers. In particular, a wafer may be transferred within a FOUP between an equipment front-end module (EFEM) 150 and a respective process module 110 via a transfer module 190 during processing. Load ports 160 are configured for moving wafers to and from the EFEM 150 during pre-processing and post-processing.

The EFEM 150 is configured for moving wafers between the atmosphere and vacuum (the processing environment of the PM 110). EFEM 150 is configured for moving wafers between the FOUP and the load-locks 170. Transfer robots 131 (e.g., robot arms and the like) transfer wafers between load ports 160 and appropriate load locks 170 along track 152. Various gate valves 180 in combination with load locks 170, transfer module 190, and process module 110 may be employed to maintain or create appropriate pressures (e.g., atmosphere, vacuum, and transitions between the two). Gate valves 180 are configured to isolate components during movement and/or processing of wafers, especially when wafers are exposed to various pressures in system 100. For instance, gate valves 180 may isolate the EFEM 150, load locks 179, transfer module 190 and process modules 110. Load locks 170 include transfer devices to transfer substrates (e.g., wafers in FOUPs) from the EFEM 150 to the transfer module 190. The load locks 170 may be evacuated under pressure before accessing a vacuum environment maintained by the transfer module 190, or may be vented to atmosphere before accessing the EFEM 150. For example, load locks 170 may be coupled to a vacuum source (not shown) so that, when gate valves 180 are closed, load locks 170 may be pumped down. As such, the load locks 170 may be configured to maintain a desired pressure, such as when transferring wafers under vacuum pressure between the load locks 170 and the transfer module 190, or when transferring wafers under atmospheric pressure between the load locks 170 and the EFEM 150.

The transfer module 190 is configured to transfer substrates (e.g., wafers in the load locks 170) to and from the process modules 110 via gate valves 180. In one configuration, the gate valves 180 include controllable openings (e.g., access doors) allowing access to the adjacent modules (e.g., transfer module 190, EFEM 150, process module 110, etc.). Within the transfer module 190, transfer robots 132 (e.g., robot arms and the like) are configured to move process wafer 101 within the vacuum environment using track 133, such as transferring wafers between process modules 110, or to and from the load locks 170. The transfer module 190 and the process modules 110 typically operate under vacuum, and may be coupled with one or more vacuum source(s) (not shown) to maintain the appropriate vacuum pressure.

One or more process modules 110 may be coupled to the transfer module 190. Each of the process modules 110 are configured to process wafers, or any suitable object requiring processing in a vacuum or other controlled environment. The process modules 110 may be a single station or multistation configuration. The depicted process module 110 comprises four process stations, numbered from 1 to 4 in the embodiment shown in FIG. 1. For example, the process modules 110 may be configured to implement one or more semiconductor manufacturing processes. In one configuration, the process modules 110 include a plasma processing chamber. In general, the process modules 110 can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCPTM) processing chamber, or in an electron cyclotron resonance (ECR) processing chamber. An example of a high-flow plasma processing chamber or process module that can provide high density plasma is disclosed in commonly-owned U.S. Pat. No. 5,948,704. For illustration of chambers located in process modules, parallel plate plasma processing chambers, electron-cyclotron resonance (ECR) plasma processing chambers, and transformer coupled plasma (TCPTM) processing chambers are disclosed in commonly-owned U.S. Pat. Nos. 4,340,462; 4,948, 458; 5,200,232 and 5,820,723.

Figure 2:
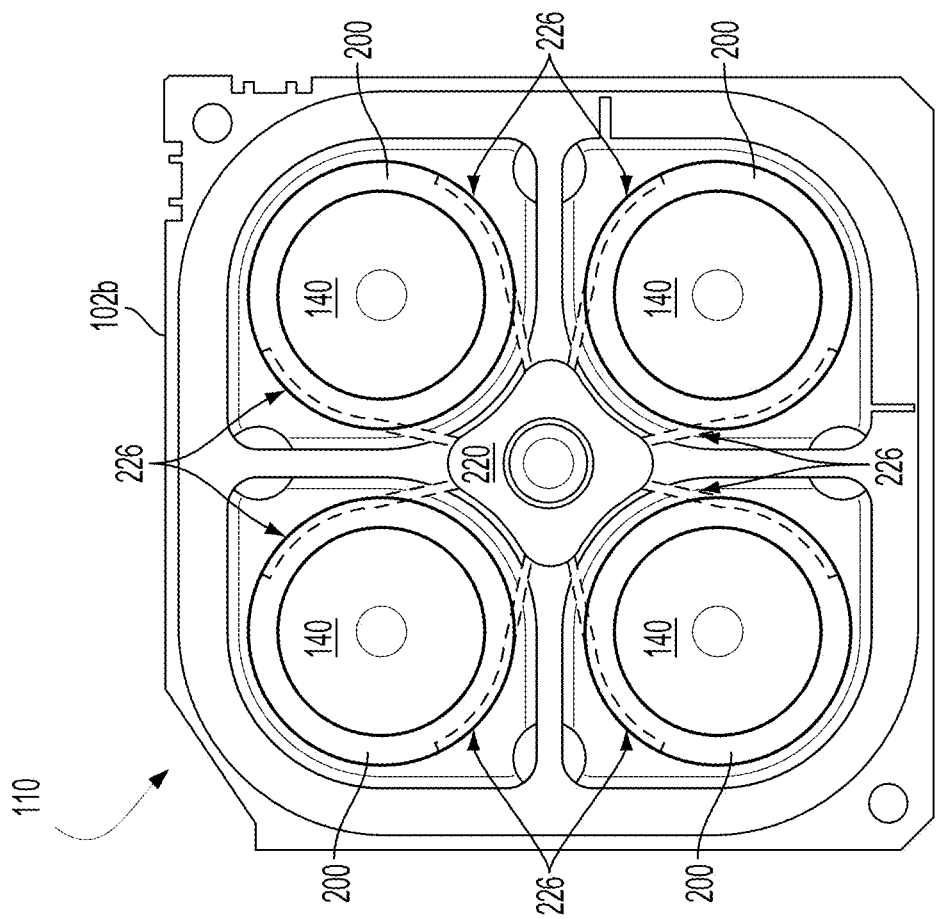
FIG. 2 illustrates a top view of a multi-station processing tool and/or process module, wherein four processing stations are provided, in accordance with one embodiment.

FIG. 2 illustrates a top view of a multi-station processing tool or process module 110, wherein four processing stations are provided. This top view is of the lower chamber portion 102b (e.g., with a top chamber portion removed for illustration), wherein four stations are accessed by spider forks 226. Each spider fork, or fork includes a first and second arm, each of which is positioned around a portion of each side of a pedestal 140. In this view, the spider forks 226 are drawn in dash-lines, to convey that they are below a carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
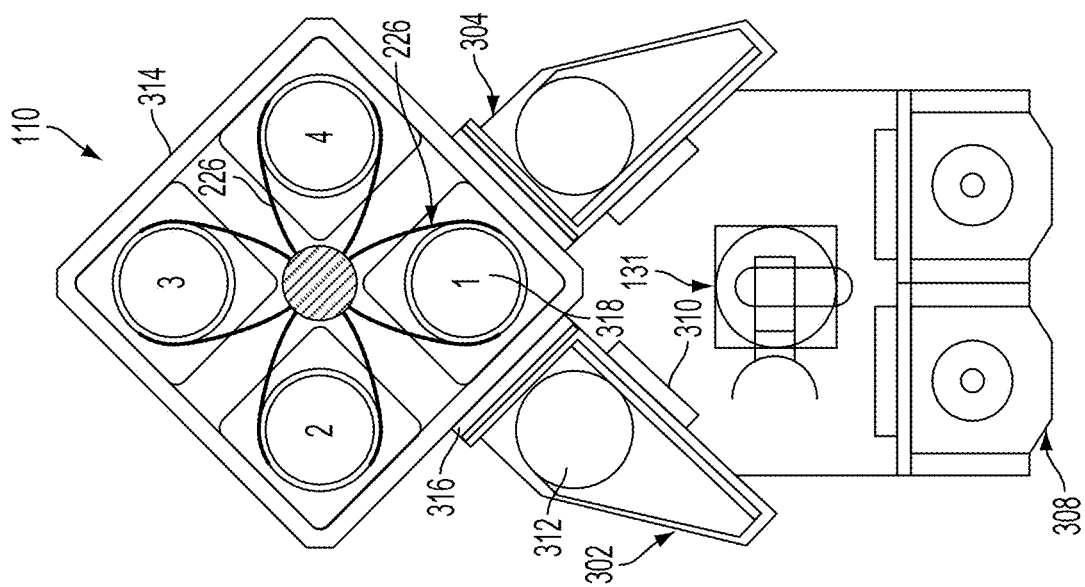
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool or process module 110 with an inbound load lock 302 and an outbound load lock 304. A robot 131, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown, such as robot 312 of a vacuum transfer module 190) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102b. The spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

FIGS. 4A-4E are diagrams illustrating the process for determining an offset from an initial calibrated location of a rotation axis of a rotation device within a process module, wherein the offset is caused by a process condition imposed on the process module, in embodiments of the present disclosure.

Figure 4B:
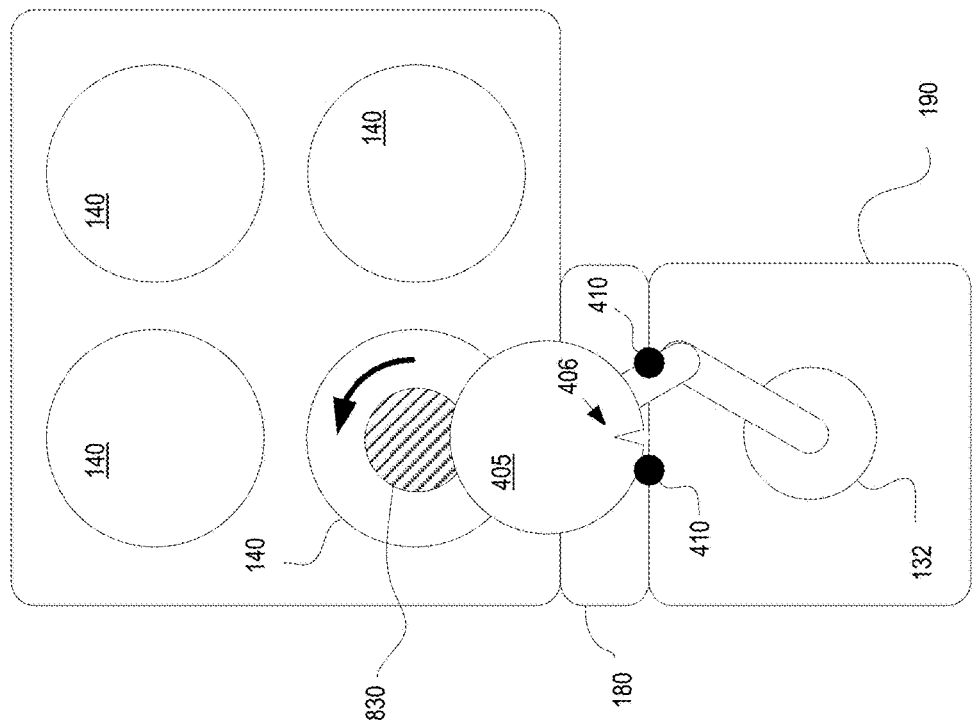
FIG. 4B illustrates an outgoing wafer from the multi-station process module introduced in FIG. 4A showing the orientation of the outgoing wafer for purposes of determining an offset of a rotation axis of a device within the process module that is under a process condition, in accordance with one embodiment of the present disclosure.
Figure 4A:
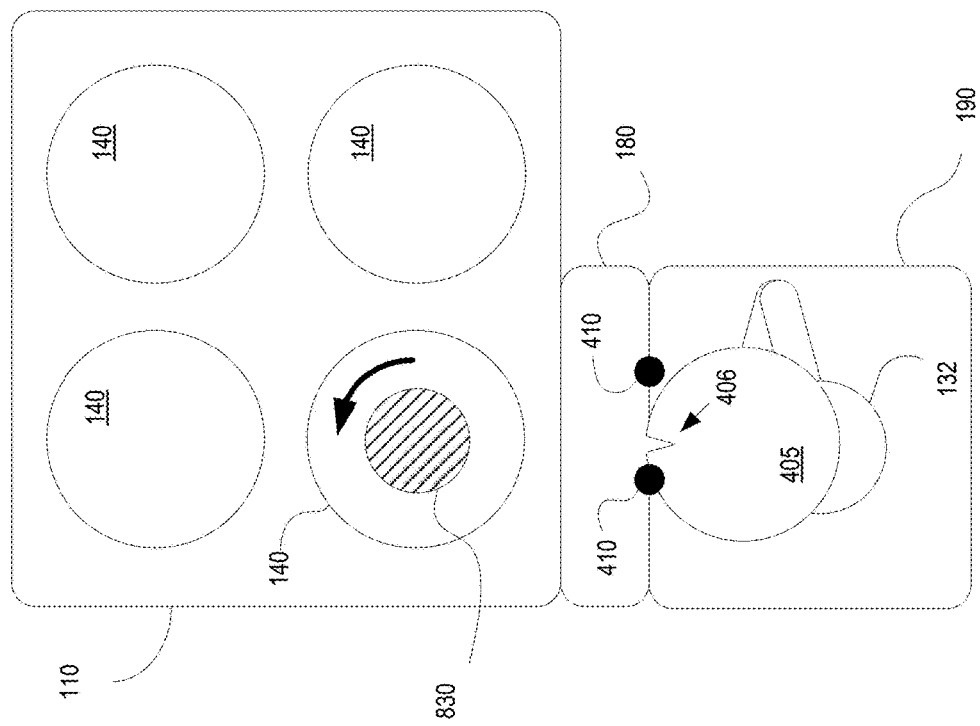
FIG. 4A illustrates an incoming wafer to a multi-station process module showing the orientation of the incoming wafer for purposes of determining an offset of a rotation axis of a device within the process module that is under a process condition, in accordance with one embodiment of the present disclosure.

In particular, FIG. 4A illustrates an incoming calibration wafer 405 to a multi-station process module showing the orientation of the incoming calibration wafer 405 for purposes of determining an offset of a rotation axis of a device within the process module 110 that is under a process condition, in accordance with one embodiment of the present disclosure. In particular, robot 132 is delivering the calibration wafer from the vacuum transfer module 190 to the process module 110 via the gate valve 180. The calibration wafer 405 is being delivered to the station 140 closest to the gate valve 180. Station 140 may include a pedestal configured for supporting a wafer. The orientation of the calibration wafer 405 is indicated by the notch 406, wherein in the incoming orientation, the notch 406 is pointed towards the station 140, such that the notch 406 first enters the gate valve or first passes through the AWC sensors 410 with the incoming calibration wafer 405.

As previously introduced, process module 110 is configured for processing wafers in a vacuum or controlled environment. For example, the process module 110 may be configured to implement one or more semiconductor manufacturing processes. For example, process module 110 includes a multi-station plasma processing chamber for generating plasma to facilitate various processes that include the depositing of a material during a deposition or etching process, such as ALD and PECVD processes. The chamber may include one or more of electrodes, substrate support, electrostatic chuck in the substrate support (configured to include electrodes biased to a high voltage in order to induce an electrostatic holding force to hold the wafer in position), one or more gas showerheads, gap control mechanisms, for controlling the gap between the substrate support and the showerheads. For purposes of brevity and clarity, detailed descriptions of the various other components of the chamber and/or process module 110 that are known to those skilled in the art are not provided, but are contemplated and fully supported.

In addition, station 140 may include a lift pad (also referred to as twist pad) configured for rotation. The lift pad is configured to lift a wafer off the pedestal 140 and rotate a wafer disposed thereon with respect the process module 110 and/or the corresponding pedestal 140. For purposes of illustration, the lift pad may be used within process modules performing ALD and PECVD processes and/or applications. For example, one or more motors may be configured to lift a wafer processing pedestal 140 (e.g., function of an existing pedestal-lift device) and also lift a wafer off the pedestal with a lift pad. In one embodiment, the lift pad is approximately sized to a wafer. In another embodiment, the size of the lift pad is smaller than a wafer. The lift pad may be separately controlled from the pedestal, such that the lift pad may be separated from the pedestal for purposes of rotation. For example, upon separation o of the lift pad from the pedestal, a wafer supported by the lift pad rotates with the rotation of the lift pad. As such, the pedestal 140 and the process chamber or process module enclosing the pedestal remain fixed in relation to the lift pad that is rotating.

In embodiments of the disclosure rotation of the wafer may be performed using any rotation device located within the process module 110 for purposes of determining an offset of a rotation axis of a device within the process module 110 that is caused by a process condition imposed on the process module 110. For example, a rotation device may be located on the end effector of a spindle or spider forks configured to rotate the stations and or pedestals 140 within the process module 110. One type of spindle may be the rotation mechanism 220 and/or spider forks 226 previously introduced in FIG. 2. The rotation device is configured to rotate a wafer as the entire spindle normally rotates between the stations 140. For example, the rotation device on the end effector may rotate a wafer effectively between 0-180 degrees in a clockwise or counter-clockwise fashion in embodiments, while the spindle is transferring wafers from one processing station to another processing station (e.g., stations located 90, 180, or 270 degrees apart) within a quad-station or multi-station process module 110. The wafer rotation mechanism and/or device is located concentrically on the spindle end effector where wafer transfer is being performed.

As shown in FIG. 4A, the gate valve 180 may include active wafer centering (AWC) sensors 410. The AWC sensors 410 are configured to perform intransit wafer position measurement and correction, as will be further described below in FIGS. 4E, 6A-6B and 7. For example, the AWC sensors 410 may be vertically mounted through-beam sensors. The AWC sensors 410 may be mounted such that their respective beams extend along the Z-axis, which is perpendicular to the page of FIG. 4A. As such, AWC sensors 410 detect when their respective beams are broken, such as when an opaque object (e.g., a wafer or a portion of an end-effector) blocks their beam. In general, a wafer may trigger the AWC sensors 410 two or more times as the wafer is in transit (e.g., the wafer may pass through the AWC sensors 410 in one direction, or back and forth to increase the number of data points). Up to four points on the wafer may be triggered and used to measure a position/location of the wafer (e.g., a center of wafer) within a reference coordinate system (not shown). That position may be used for alignment correction, and to determine a condition offset of the rotation axis of the rotation device within the process module 110. For example, the AWC sensors 410 may be part of a measurement device that is used to measure wafer position relative to a calibration set of data. The calibration set of data generates a calibrated reference measurement that is aligned with an initial calibrated location of the rotation axis (e.g., during cold set-up). During tool set-up, a wafer is centered onto the pedestal 140 using centering techniques (e.g., feature alignment). The calibration wafer 405 is picked up by the robot 132, and the calibration wafer 405 is moved in and out of the process module 110 at full speed, while recording the robot location of the calibration wafer within a reference coordinate system (e.g., wherein the measurement device is fixed within the reference coordinate system) when sensor beams corresponding to the AWC sensors 410 are broken. That measurement data is used to determine the wafer position within the reference coordinate system. Examples of the use of AWC sensors for calibrating robots are disclosed in commonly owned U.S. Pat. No. 6,934,606.

FIG. 4B illustrates an outgoing calibration wafer 405 from the multi-station process module 110 introduced in FIG. 4A showing the orientation of the outgoing calibration wafer 405 for purposes of determining an offset of a rotation axis of a device within the process module that is under a process condition, in accordance with one embodiment of the present disclosure. In particular, robot 132 is delivering the calibration wafer from the process module 110 to the transfer module 190 via the gate valve 180. The orientation of the calibration wafer 405 is indicated by notch 406, which in the outgoing orientation, the notch 406 has been rotated by an angle and is pointed away from the station 140, such that the notch 406 first enters the gate valve or first passes through the AWC sensors 410 for the outgoing calibration wafer 405. That is, between the two orientations of the incoming calibration wafer 405 and the outgoing calibration wafer 405, the wafer has been rotated by approximately 180 degrees. In embodiments, the rotation of the calibration wafer 405 may be an angle between a range that is greater than 0 degrees and equal to or below 180 degrees for determining the offset of the rotation access of a process module under a process condition. In embodiments, the angle the wafer is rotated can be one of approximately 5, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, and 180 degrees. In embodiments, the rotation of the calibration wafer 405 may be an effective angle defined within an effective range, wherein one range is defined as being greater than 0 and up to and including 15 degrees, another range is defined as between 5 and 20 degrees, another range is defined as between 10 and 25 degrees, another range is defined as between 15 and 30 degrees, another range is defined as between 20 and 35 degrees, another range is defined as between 25 and 40 degrees, another range is defined as between 30 and 45 degrees, another range is defined as between 35 and 50 degrees, another range is defined as between 40 and 55 degrees, another range is defined as between 45 and 60 degrees, another range is defined as between 50 and 65 degrees, another range is defined as between 55 and 70 degrees, another range is defined as between 60 and 75 degrees, another range is defined as between 65 and 80 degrees, another range is defined as between 70 and 85 degrees, another range is defined as between 75 and 90 degrees, another range is defined as between 80 and 95 degrees, another range is defined as between 85 and 100 degrees, another range is defined as between 90 and 105 degrees, another range is defined as between 95 and 110 degrees, another range is defined as between 100 and 115 degrees, another range is defined as between 105 and 120 degrees, another range is defined as between 110 and 125 degrees, another range is defined as between 115 and 130 degrees, another range is defined as between 120 and 135 degrees, another range is defined as between 125 and 140 degrees, another range is defined as between 130 and 145 degrees, another range is defined as between 135 and 150 degrees, another range is defined as between 140 and 155 degrees, another range is defined as between 145 and 160 degrees, another range is defined as between 150 and 165 degrees, another range is defined as between 155 and 170 degrees, another range is defined as between 160 and 175 degrees, another range is defined as between 165 and 180 degrees, another range is defined as between 170 and 185 degrees, another range is defined as between 175 and 190 degrees.

Figures 4C, 4D:
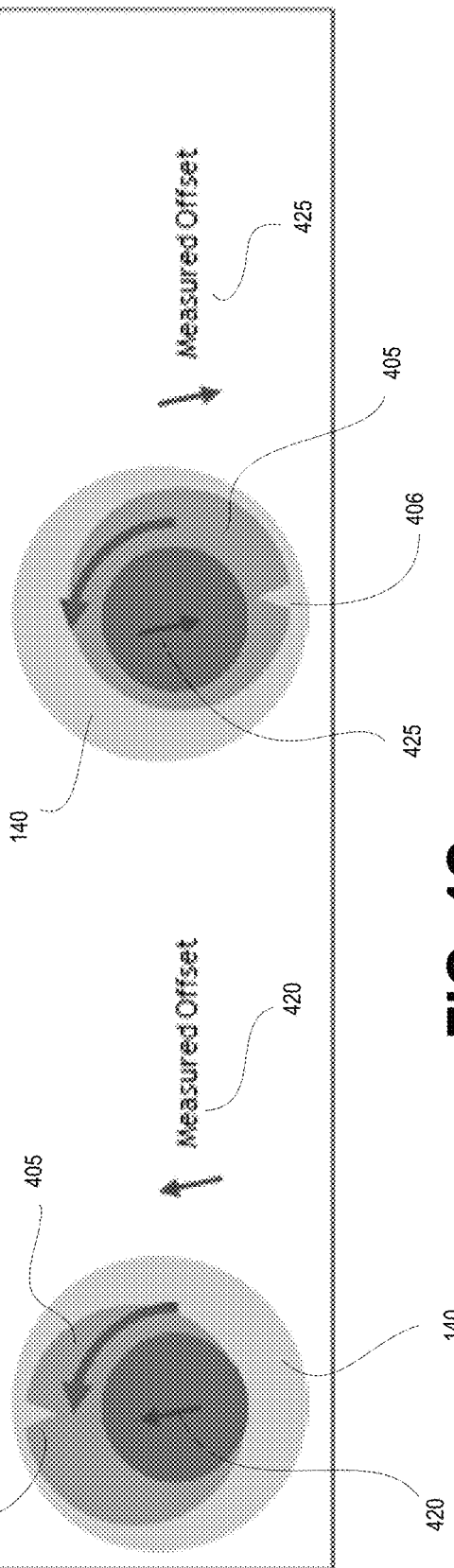
FIG. 4C illustrates the process of determining an offset of a rotation axis of a device within a process module that is under a process condition using measurements of an incoming wafer and an outgoing wafer, in accordance with one embodiment of the present disclosure.
FIG. 4D illustrates an example of calculating an offset correction vector, in accordance with one embodiment of the present disclosure.

FIG. 4C illustrates the process of determining an offset of a rotation axis of a rotation device (e.g., lift pad) within a process module 110 that is under a process condition (e.g., high temperature, vacuum, etc.) using measurements of an incoming calibration wafer 405 and an outgoing calibration wafer 405, as previously introduced in FIGS. 4A-4B, in accordance with one embodiment of the present disclosure. Embodiments of the present disclosure are used to teach a robot (e.g., the TM robot 132) to station (e.g., to move to the center of the pedestal 140) when the process module 110 is under a process condition. The motion coordinate system of the TM robot 132 can be a radial (R), theta (T), and vertical (Z), for each arm of the robot 132. Another motion coordinate system of the TM robot 132 can include an X-axis, a Y-axis, and a Z-axis. Still other coordinate systems are supported. Previously, the challenge in most PECVD or ALD semiconductor processing applications is putting any sensors inside of the process module 110, since it is under high temperatures (e.g., 650 Celsius), and may be under vacuum. That is, the sensors are inoperable when process conditions are imposed on the process module 110. As such, previous to embodiments of the present disclosure, the offset to any point in the process module caused by imposing a process condition on the process module could not be determined.

Embodiments of the present disclosure take advantage of a rotation device within the process module 110 to rotate a calibration wafer 405 by an angle (between orientations of an incoming calibration wafer 405 and an outgoing calibration wafer 405) and take measurements of the incoming and outgoing calibration wafer 405 using a measurement device (e.g., AWC sensors 410) located outside of the process module 110 in order to determine the offset of a rotation axis of a rotation device located within the process module 110. Specifically, movement of the incoming calibration wafer 405 (as measured) to the outgoing calibration wafer (as measured) indicates the offset of the rotation axis of the rotation device caused by imposing the process condition on the process module 110, as will be further described in FIGS. 6A-6B.

Generally, the incoming calibration wafer 405 offset relative to the AWC coordinate frame can be measured (e.g., measured offset 420) using the AWC sensors 410 (e.g., measurement #1). For example, the offset is measured from a perfectly aligned wafer measurement as defined by the AWC coordinate frame, such as the center of the AWC coordinate frame. The AWC sensors 410 can measure the wafer offset again (e.g., measured offset 425) using the AWC sensors 410 on the outgoing calibration wafer 405, after rotation of the wafer. That is, the positions of the incoming calibration wafer 405 and the outgoing calibration wafer 405 at a specific point in the system (e.g., as the wafer is passing through the gate valve 180 at the AWC sensors 410) is measured against a reference coordinate frame (e.g., the AWC coordinate frame) established during tool setup, wherein the reference coordinate frame corresponds to an incoming and outgoing wafer perfectly aligned with an initial calibrated location (e.g., teach location) of the center of the pedestal (e.g., rotation axis) where wafers are to be placed. The difference between measurements (e.g., the end points of the offsets in the reference coordinate frame) should only be a result of the "offset wafer rotation," or offset of the rotation axis of the rotation device. This difference may be represented by a vector between the two measured locations within the reference coordinate system. Assuming that the rotation device has a negligible radial runout relative to their center axis (e.g., rotation axis) (e.g., spindle end-effector or center axis of lift pad of a pedestal 140), the differences in the AWC measurements should be double the offset of the wafer relative to the pedestal, as will be further described in FIGS. 6A-6B. This defines the required teach position change to handoff wafers centered to the pedestal 140 while the process module is under a process condition.

FIG. 4D illustrates an example of calculating an offset correction vector and/or condition correction vector, in accordance with one embodiment of the present disclosure. In particular, the offset correction vector in x and y coordinates is based measurements of at least: an inbound AWC value, and an outbound AWC value.

Figure 4E:
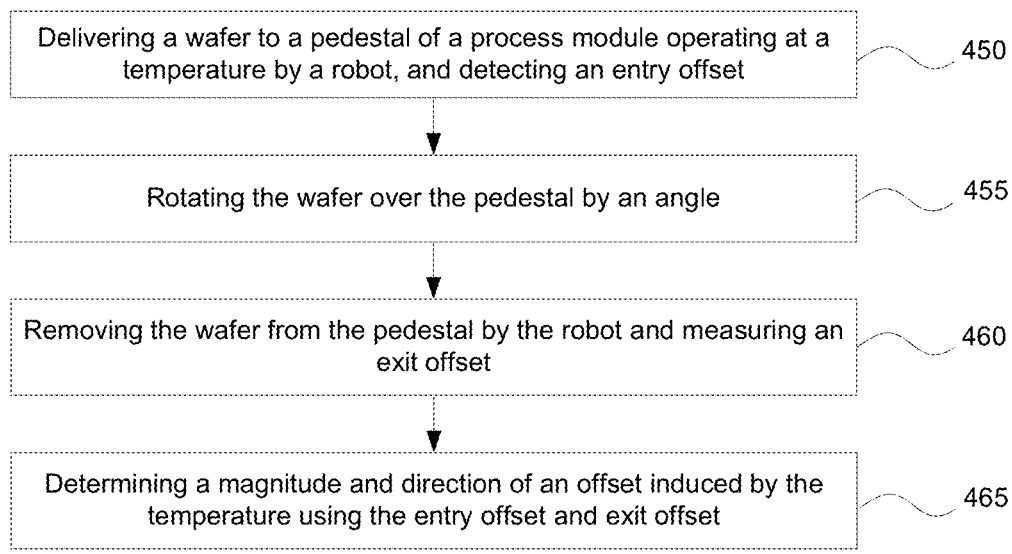
FIG. 4E is a flow diagram illustrating a method for determining a temperature induced offset of pedestal in a process module that is under a process condition, in accordance with one embodiment of the present disclosure.

FIG. 4E is a flow diagram 400E illustrating a method for determining a temperature induced offset of pedestal in a process module that is under a process condition, in accordance with one embodiment of the present disclosure. To determine the temperature induced offset, the process module is placed under the same process condition used for processing wafers. For example, the process module is placed under the temperature conditions used when processing wafers. The proper temperature selected depends on which process is used. The method in the present disclosure is discussed with reference to specific components of the plasma processing system 100, wherein flow diagram 400E may be implemented within the above referenced wafer processing system 100.

At 450, the method includes delivering a wafer to a pedestal of a single or multi-station process module by a robot, and detecting an entry offset. The wafer may be a calibration wafer used during calibration procedures. The robot may be robot within a vacuum transfer module, such as robot 132. The pedestal may be configurable as a rotating device, such that the pedestal itself or a component of a pedestal assembly is rotatable. The entry offset is measured from or against a calibrated reference measurement that is defined within a reference coordinate system that is based on an initial calibrated location of the pedestal within the process module. In particular, the calibrated reference measurement defines a perfectly aligned wafer that is entering the process module, and is perfectly aligned to be placed to the center of the pedestal. The calibrated reference measurement may be determined when the process module is not under a process condition, as will be further described in relation to FIG. 5A.

At 455, the method includes rotating the wafer over the pedestal by an angle. In particular, the pedestal assembly previously introduced may include a pedestal and a lift pad, wherein the lift pad is configured for rotation with respect to the pedestal. For example, the wafer may be placed on the pedestal assembly. The lift pad is separated from the pedestal, and rotated along or about a rotation axis (e.g., the axis defining the center of the pedestal), and the lift pad is rotated relative to the pedestal between at least a first angular orientation and a second angular orientation defining the angle.

At 460, the method includes removing the wafer from the pedestal by the robot and measuring an exit offset. The exit offset is measured from or against the calibrated reference measurement that is defined within the reference coordinate system.

At 465, the method includes determining a magnitude and direction (e.g., vector components) of the temperature induced offset using the entry offset and the exit offset. As previously described, the difference between measurements (e.g., the end points of the offsets in the reference coordinate frame) should only be a result of the "offset wafer rotation," or offset of the rotation axis of the rotation device. This difference may be represented by a vector between the two measured locations within the reference coordinate system. In particular, the temperature induced offset corresponds to the movement or offset of the center of the pedestal from an initial calibrated location (e.g., a cold teach location) when the process module is under the process temperature. From the difference vector, halving the magnitude of the difference vector will determine the temperature induced offset of the center of the pedestal from its initial calibrated location. Specifically, the mid-point of the vector defines the end point of the temperature induced offset, with respect to the calibrated reference measurement that is aligned (or translated) with the initial calibrated location of the pedestal. A temperature correction of the center of the pedestal may be determined based on the temperature induced offset.

Figure 5A:
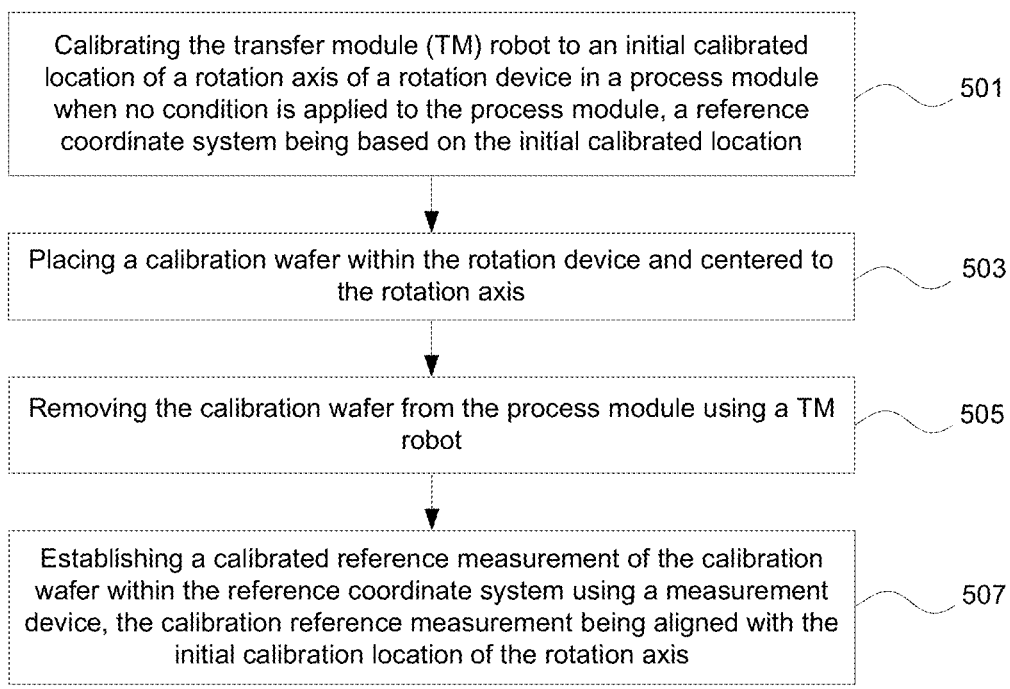
FIG. 5A is a flow diagram illustrating a method for determining a calibrated reference measurement (e.g., initialized location) of a calibration wafer held by a transfer module (TM) robot as measured by a measuring device, wherein the location of the calibrated reference measurement is aligned with the initial calibrated location of a rotation axis of a rotation device within a process module, in accordance with one embodiment of the present disclosure.
Figure 5B:
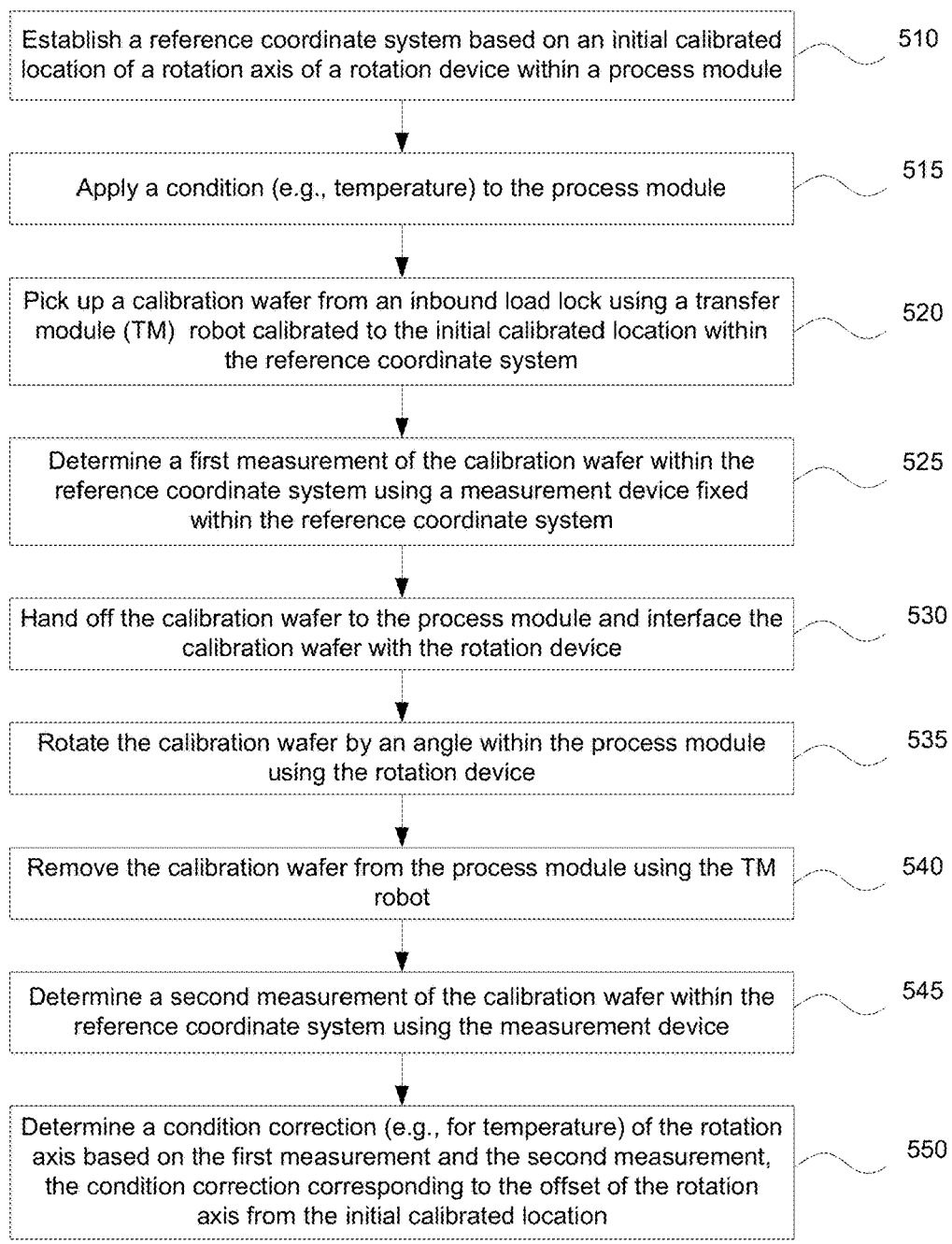
FIG. 5B is a flow diagram illustrating a method for determining an offset of a rotation axis of a rotation device located within a process module that is under a process condition using the calibrated reference measurement of the calibration wafer, in accordance with one embodiment of the present disclosure.
Figure 5C:
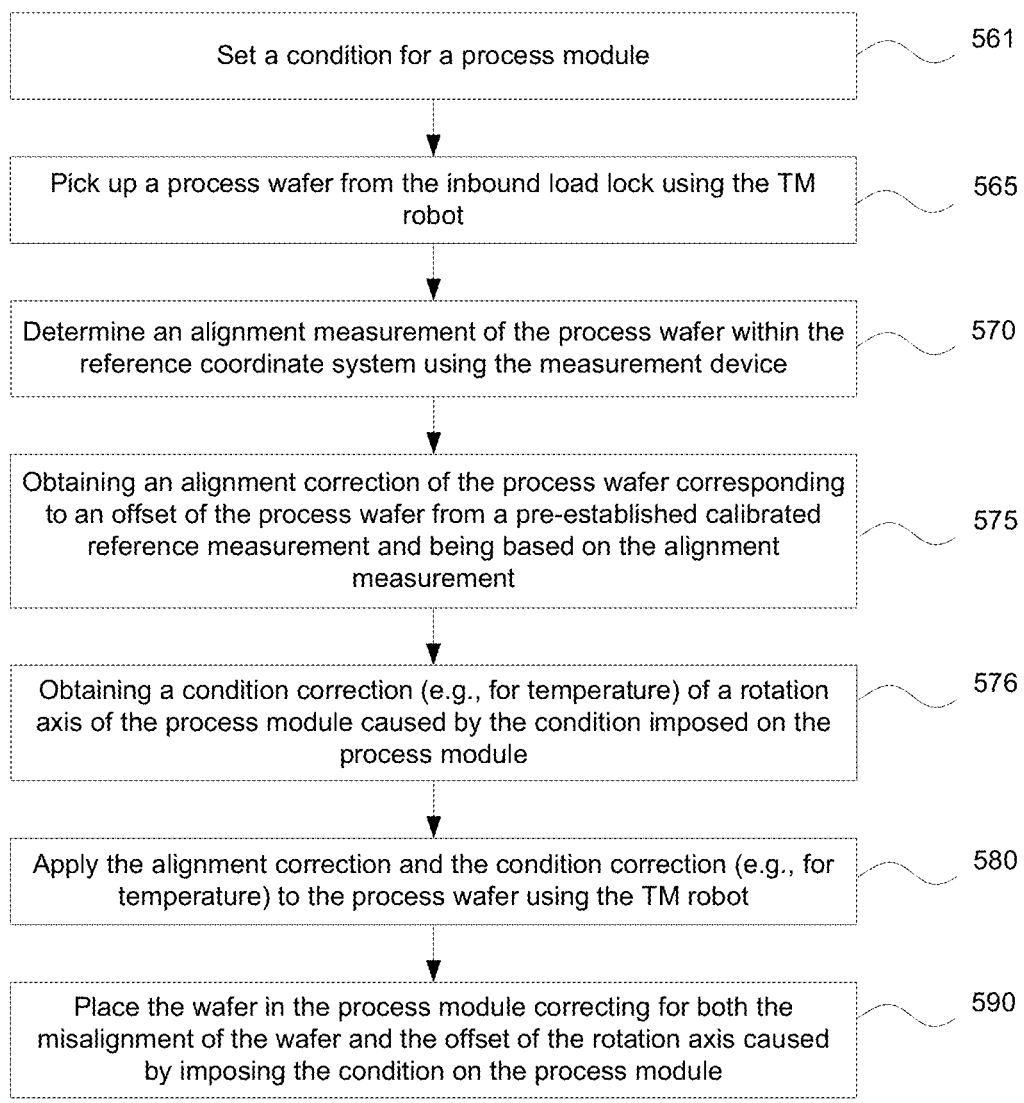
FIG. 5C is a flow diagram illustrating a method for determining an alignment offset of an incoming process wafer from the calibrated reference measurement, and applying an alignment correction based on the alignment offset and a condition correction based on the offset of the rotation axis to the incoming process wafer, in accordance with one embodiment of the present disclosure.

With the detailed description of the various modules of the plasma processing system 100 and plasma process modules 110, flow diagrams 500A-500C of FIGS. 5A-5C disclose methods for determining calibrated reference measurements, a condition correction of a process module, and an alignment correction of an incoming wafer under process. Method 500A and the other methods (e.g., methods 400E, 500B and 500C) in the present disclosure are discussed with reference to specific components of the plasma processing system 100, wherein flow diagrams 500A-500C are implemented within the above referenced wafer processing system 100. For example, various sensors and components of system 100 are employed to facilitate calibration of the TM robot 132, and the determination of an offset of a rotation axis of a rotation device within a process module 110.

In particular, flow diagram 500A discloses a method for determining a calibrated reference measurement (e.g., initialized location) of a calibration wafer held by a transfer module (TM) robot as measured by a measuring device, wherein the location of the calibrated reference measurement is aligned with the initial calibrated location of a rotation axis of a rotation device within a process module, in accordance with one embodiment of the present disclosure. Flow diagram 500A may be implemented in combination with and may include various processes performed in a calibration of a TM robot 132 of a vacuum transfer module 190, for example. In particular, flow diagram 500A may be performed to establish a reference coordinate system typically used for aligning incoming process wafers, and also for determining an offset of the rotation axis of a rotation device within the process module 110.

Though flow diagram is described in relation to TM robot 132 and an AWC measurement device (e.g., AWC sensors 410) to determine the offset of the rotation axis, other embodiments are well suited to using other robots within the plasma processing system 100 of FIG. 1 and other measurement systems. For example, aligners coupled to other robots located outside of the process module 110 may be used for determining measurements of wafers. That is, the measurements of the positions of a wafer may be taken at any point within the plasma processing system 100 as long as the robots and/or components of the system 100 have been initially setup and calibrated to each other. In that manner, the path of a wafer delivered through processing system 100 and placed eventually at a pedestal center point is known and calibrated. As such, the pedestal center point can be translated to any point along that path and used to create a reference coordinate system.

At 501, the method includes teaching the TM robot 132 to an initial calibrated location of the pedestal 140. This teaching of the TM robot 132 may be performed during setup of the TM robot 132. In particular, the TM robot 132 is calibrated by teaching the robot 132 the center of the pedestal 140 of a process module 110, wherein a wafer that is perfectly aligned is placed to the center of pedestal 140 (e.g., the center of wafer is aligned with the center of the pedestal). In one embodiment, the center of the pedestal 140 corresponds to the center axis of both the pedestal 140 and the lift pad. FIG. 6A shows the initial calibrated location 601 of the pedestal 140, which also corresponds to the rotation axis of the lift pad. The initial calibrated location 601 may also correspond to (e.g., centered with) an initialized coordinate system 660 that may be translated throughout the plasma processing system 100, such as with the reference coordinate system 660', as described below.

As such, the center axis also corresponds to the rotation axis of the lift pad, which is configured for rotating a wafer with respect to the pedestal 140 and/or the process module 110. The teaching is typically performed when no condition is imposed on or applied to process module 110. For example, this would allow the field technician to perform the setup procedures, such as for the TM robot 132 and other components of plasma processing system 100. In one exemplary setup process, the field technician can manually place the end-effector of the TM robot 132 at the center of the pedestal 140 to calibrate the TM robot 132.

As previously described, once the center axis of the pedestal 140 is determined, and the robot is calibrated, a reference coordinate system 601' can be established at any point along a calibrated path that a wafer would take to be placed to or remove from the calibrated center of the TM robot 132. That is, the reference coordinate system 601' is based on the initial calibrated location of the center of the pedestal.

Determination of the calibrated path is further described below in relation to the TM robot 132, for example. At 503, the method includes placing the calibration wafer on or within the rotation device (e.g., lift pad, end-effector of spindle, etc.) within the process module 110 and centered to the rotation axis. In one implementation, a calibration wafer 405 may be placed (e.g., hand placed) to the center of the pedestal 140. For example, the calibration wafer 405 may be placed using centering techniques (e.g., aligning with features in the process module 110 and/or pedestal 140). As such, the calibration wafer 405 is assumed to be perfectly aligned to the rotation axis of the rotation device (e.g., lift pad).

At 505, the method includes removing the calibration wafer 405 from the process module 110 using the TM robot 132. The removal is along a calibrated path, since the wafer is assumed to be perfectly aligned with the initial calibrated location of the center of the pedestal, and the robot is assumed to follow the same path when removing a perfectly aligned wafer and/or placing a perfectly aligned wafer to the center of pedestal 140. For example, FIG. 6A shows state 409B of calibration wafer 405 as centered to the initial calibrated location 601 of the rotation axis of the rotation device (e.g., lift pad). The perfectly aligned calibration wafer 405 is removed from the process module 110 to state 409A along the calibrated path. This removal is shown by double arrow 691 indicating an incoming wafer and an outgoing wafer that is perfectly aligned to the initial calibrated location 601.

At 507, the method includes establishing a calibrated reference measurement of the calibration wafer within the reference coordinate system using the measurement device. For example, the measurement device may be an AWC system including AWC sensors 410. The calibrated reference measurement is aligned with the initial calibrated location of the rotation axis corresponding to the rotation device (e.g., lift pad). For purposes of illustration, the calibrated reference measurement may be taken at a particular location within the measurement device. For example, the calibrated reference measurement may be taken when the calibration wafer that is aligned with the initial calibrated location of the rotation axis first engages with the AWC sensors 410 along an incoming path. The calibration wafer may be moved back and forth between the gate valve 180 and the transfer module 190 through the measurement device (e.g., AWC sensors 410) to gather a calibration set of data. The calibrated reference measurement based on the calibration set of data may be or correspond to center of the calibration wafer 405. For example, in FIG. 6A, the calibrated reference measurement 601' may correspond to the center 630A of the calibration wafer 405 in state 409A that is at the previously introduced particular location within the measurement device (e.g., first engaging with the AWC sensors 410 along an incoming path). Further, the reference coordinate system 660' may correspond to (e.g., be centered with) the calibrated reference measurement 601' for purposes of illustration, though the reference coordinate system 660' may be centered at any location as long as it is fixed in relation to the initial calibrated location 601 of the rotation axis and its initialized coordinate system 660.

FIG. 5B is a flow diagram 500B illustrating a method for determining an offset of a rotation axis of a rotation device (e.g., lift pad of pedestal 140) located within a process module 110 that is under a process condition using the calibrated reference measurement 601' of the calibration wafer 405, in accordance with one embodiment of the present disclosure. FIG. 5B may be described in conjunction with FIG. 6A that illustrates the calibrated reference measurement 601' of a calibration wafer 405 that is aligned with the initial calibrated location 601 of a rotation axis of a rotation device (e.g., lift pad) within a process module. In addition, FIG. 6A shows the effect that an offset of the rotation axis of the rotation device within a process module 110 has on the calibration wafer 405 when the calibration wafer is rotated, in accordance with one embodiment of the present disclosure. By measuring the effect, the offset of the rotation axis can be determined without using sensors placed within the process module 110.

At 510, the method includes establishing a reference coordinate system 660' based on an initial calibrated location 601 of a rotation axis of a rotation device within a process module. The reference coordinate system 660' was established in flow diagram 500A and illustrated in FIG. 6A.

In addition, at 515 the method includes applying a condition to the process module 110. The condition may conform with a process condition imposed on the process module 110 for purposes of performing ALD and/or PECVD processes on wafers 101. For example, the process condition may include an elevated temperature of the process module 110. For example, various processes may be performed at temperatures between 200-650 degrees Celsius. Higher and lower temperatures are also contemplated. In addition, the process condition may include other elements, such as vacuum pressure, etc. For instance, the process module 110 may be placed under vacuum and increased temperatures during wafer processing. The process condition may have an effect on one or more points within the process module 110. For example, the process condition may move the initial calibrated location 601 of the rotation axis of the rotation device (e.g., lift pad) by an offset 625. That the elements of the process condition, taken alone or in combination, may have an effect on the initial calibrated location 601. For instance, an increase of the temperature of the process module 110 may move the center of the pedestal, thereby moving the initial calibrated location 601. In addition, placing the process module 110 under vacuum pressure may also move the initial calibrated location 601. This offset of the initial calibrated location 601 may be on the order of millimeters or greater, which would have an adverse effect on semiconductor processing.

At 520, the method includes picking up a calibration wafer from an inbound load lock using a transfer module (TM) robot 132 configured to transfer the calibration wafer 405 to the process module 110. The calibration wafer need not be perfectly aligned within the TM robot 132 and/or the initial calibrated location 601. That is, embodiments of the present disclosure are able to determine the offset of the rotation axis using a calibration wafer 405 that is normally picked up by the robot 132 and that may by misaligned from the calibrated reference measurement 601', and measuring a location of the calibration wafer 405 along its incoming path (without correction for misalignment), rotating the calibration wafer 405 within the process module, and measuring a location of the calibration wafer 405 along its outgoing path.

More specifically at 525, the method includes determining a first measurement of the calibration wafer 405 within the reference coordinate system using a measurement device when transferring the calibration wafer to the process module. The measurement device is fixed within the reference coordinate system 660'. For example, the first measurement may be performed by the AWC sensors 410 when the calibration wafer is incoming into the process module 110 via gate valve 180. The first measurement may be taken with respect to the reference coordinate system 660' (e.g., defines a center of the calibration wafer 405 as measured). Though the first measurement may indicate that the calibration wafer 405 is misaligned with the initial calibrated location 601 and/or the calibrated reference measurement 601', no correction for misalignment is made when determining the offset of the rotation axis of the rotation device, even though for normal wafer processing, a correction for misalignment is made.

At 530, the method includes handing off the calibration wafer to the process module. This may include handing off the calibration wafer from one or more robots and/or components within the process module 110 before reaching its final destination—the rotation device. In addition, the method includes interfacing the calibration wafer 405 with the rotation device. For example, the interfacing may include placing the calibration wafer 405 on the lift pad and pedestal 140. In another example, the interfacing may include picking up the calibration wafer 405 by an end effector of a spindle or rotation device 220 configured to transfer wafers from one station to another in the multi-station process module 110, wherein the end-effector is configured for rotating a wafer. Still other means for interfacing the calibration to the rotation device is contemplated.

At 535, the method includes rotating the calibration wafer 405 by an angle using the rotation device. For example, the rotation device may be a lift pad that is configured for rotating a wafer placed thereon with respect to the pedestal 140 and/or the process module 110. In one embodiment, the resulting angle of rotation may effectively be greater than 0 degrees to less than or equal to 180 degrees (e.g., clockwise or counterclockwise) between an incoming orientation of the calibration wafer 405 (corresponding to the incoming path as placed on or within the rotation device) and an outgoing orientation of the calibration wafer (corresponding to the outgoing path as removed from the rotation device).

For example, when the rotation device is a lift pad, the method may include placing the calibration wafer 405 on the lift pad of the rotation device that is configured for depositing a film on a process wafer. The rotation device includes a pedestal and lift pad assembly, wherein the pedestal has a pedestal top surface extending from a central axis of the pedestal. The central axis may also correspond to the rotation axis of the lift pad. The lift pad is configured to rest upon the pedestal top surface, interface with the pedestal top surface, and/or be separated from the pedestal top surface. The method may include separating the lift pad from the pedestal top surface along the central axis. The method may include rotating the lift pad relative to the pedestal top surface between at least a first angular orientation and a second angular orientation defining the angle.

In another example, when the rotation device is an end-effector of a spindle or rotation device 220, the method may include picking up the calibration wafer from a first station in the multi-station process module 110 using an end effector (not shown) of a spindle robot (e.g., rotation device 220). The spindle robot is configured for transferring wafers between stations in the process module 110, and wherein the end effector is configured for rotating the wafer. In addition, the method includes placing the calibration wafer on the first station for removal from the process module after rotation.

At 540, the method includes removing the calibration wafer 405 from the process module using the TM robot 132. In that manner, a measurement of the calibration wafer 405 may be made outside of the process module 110. In particular, at 545, the method includes determining a second measurement of the calibration wafer 405 within the reference coordinate system 660' using the measurement device when transferring the calibration wafer to an outbound load lock. For example, the second measurement may be performed by the AWC sensors 410 when the calibration wafer is outgoing from the process module 110 via gate valve 180. The second measurement may be taken with respect to the reference coordinate system 660' (e.g., defining a center of the calibration wafer 405 as measured).

Figure 6B:
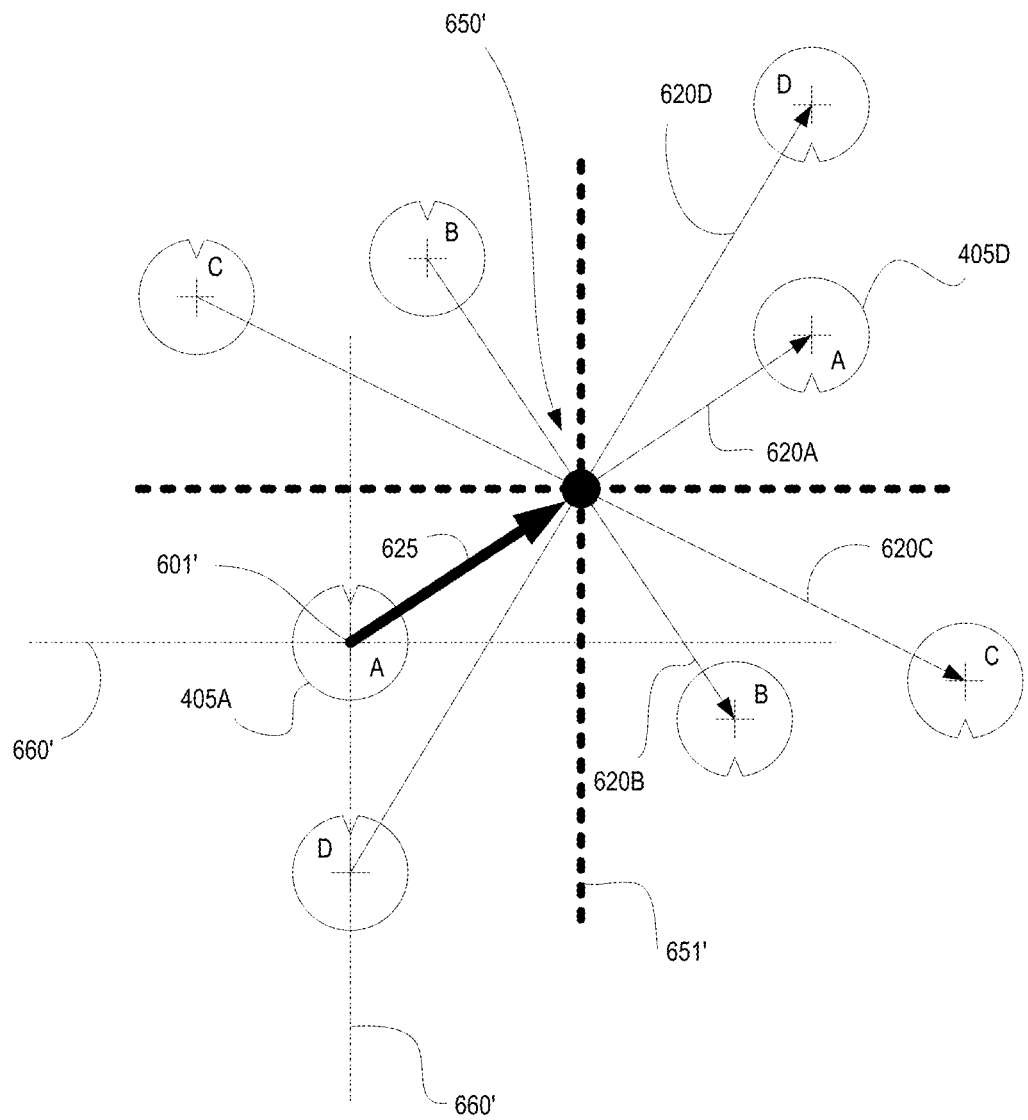
FIG. 6B is a diagram illustrating the determination of the offset of a rotation axis of a rotation device within a process module by rotating an incoming wafer by an angle by the rotation device, wherein the determination is alignment agnostic, in accordance with one embodiment of the disclosure.

For example, FIG. 6A shows the path of the calibration wafer 405 when determining the offset 625 of the rotation axis. For purposes of introduction and ease of illustrating the steps used to determine the offset 625, the incoming calibration wafer 405 is perfectly aligned with the initial calibrated location 601 of the rotation axis (e.g., center of the pedestal 140 when setup). Of course, the incoming calibration wafer 405 need not be perfectly aligned, as illustrated and described in relation to FIG. 6B, such that no matter the alignment of the incoming calibration wafer 405 the offset 625 may still be determined through measurement and rotation. As shown, state 409A shows the calibration wafer 405 along an incoming path that is perfectly aligned with the initial calibrated location 601. The first measurement corresponds with and/or is translated to the measured center 630A of the calibration wafer 405 (which when perfectly aligned also corresponds to the calibrated reference measurement 601'). After the first measurement of the calibration wafer 405 is performed, the TM robot 132 transfers the calibration wafer 405 into the process module, as indicated by arrow 691. State 405B of calibration wafer 405 shows the delivery of the calibration wafer 405 to the station or pedestal 140 which includes a rotation device (e.g., lift pad). Since the calibration wafer 405 is perfectly aligned, the center of the calibration wafer 405 is placed to the initial calibration location 601, which during setup also corresponds to the rotation axis of the rotation device (at cold temperature and at atmosphere). Because the process module 110 is now under a process condition, the rotation axis has moved or is offset from its original location. As shown, rotation axis 650 is offset from the initial calibration location 601. For example, the entire pedestal and its center axis has moved with respect to the reference coordinate system 660' by an offset 625, and the measurement device that is fixed to the reference coordinate system 660' and outside of the process module 110. As such, the calibration wafer 405 is not centered on the pedestal. State 409C of the calibration wafer 405 shows the rotation of the calibration wafer 405 by an angle (e.g., 180 degrees). After rotation, the center 630B of calibration wafer 405 moves along line 693. Pre-rotation, the notch 406 is at the top of the calibration wafer 405, and post-rotation, the notch is at the bottom of the calibration wafer 405, as shown in FIG. 6A. Calibration wafer 405 pre-rotation is shown by dotted lines, whereas calibration wafer 405 post-rotation is shown by bolded solid lines. State 409D shows the calibration wafer 405 along an outgoing path when removed from the process module 110. Because of the rotation, the outgoing path is no longer perfectly aligned with the initial calibrated location 601. A second measurement is taken and may correspond with and/or may be translated to the measured center 630D of the calibration wafer 405.

At 550, the method includes determining a condition correction of the rotation axis based on the first measurement and the second measurement. The condition correction corresponds to the offset 625 of the rotation axis 650 from the initial calibrated location 601 when the process module is under the process condition. That is, the offset 625 is caused by the process condition. FIG. 6A shows the offset 625 as a vector that is determined through the first and second measurements (e.g., the measured center 630A of the incoming calibration wafer 405 and center 630D of the outgoing calibration wafer 405). In particular, the condition correction may be performed by determining a difference vector 620A between the first measurement and the second measurement. That is, the difference vector intersects the measured locations of the centers 630A and 630D of the incoming and outgoing calibration wafer 405. As such, the difference vector would vary depending on the alignment of the incoming calibration wafer 405. The difference vector 620A is also shown as translated between lines 621 and 623 that are perpendicular to the difference vector 620A and intersect with respective centers of the calibration wafer 405 in a pre-rotation state (e.g., center 630B) and in a post-rotation state (e.g., center 630C), as shown by rotation line 693.

Further, the offset of the rotation axis from its initial calibrated location 601 is determined by halving the magnitude of the difference vector 620A to determine the end point of the offset vector 625. In particular, the offset vector 625 may be determined by placing the difference vector (e.g., 620A) between the measured centers (e.g., 630A and 630D) of the incoming and outgoing wafers 405 (e.g., the difference by the measured centers) within the reference coordinate system 660'. Half the difference vector (e.g., halving the magnitude) indicates the end point of the offset vector 625, wherein the start point of the offset vector 625 corresponds to the calibrated reference measurement 601'. In FIG. 6A, because the incoming calibration wafer is perfectly aligned, the offset vector 625 lies on the difference vector 620A. However, when the incoming calibration wafer 405 is misaligned, the offset vector 625 would not lie (e.g., have the same direction) on its corresponding difference vector, as will be shown in FIG. 6B.

As previously described, the determination of the offset vector 625 is not dependent on perfect alignment of the incoming calibration wafer 405. FIG. 6B is a diagram illustrating the determination of the offset of a rotation axis of a rotation device within a process module by rotating an incoming wafer by an angle by the rotation device, wherein the determination is alignment agnostic, in accordance with one embodiment of the disclosure. As shown, four different configuration wafers 405 are shown along four different incoming paths (e.g., horizontal path perpendicular with x-axis of the reference coordinate system 660'). The x-axis of the reference coordinate system 660' may be considered to be perfectly aligned with the initial calibrated location 601 along a perfect alignment path. In particular, configuration wafer 405A (as also shown in FIG. 6A) is perfectly aligned with the initial calibrated location 601. That is, the center 630A of configuration wafer 405A as determined by a first measurement is perfectly aligned with the calibrated reference measurement 601' of the reference coordinate system 660'. However, configuration wafer 405B is misaligned as indicated by an alignment offset of the center of the wafer 405B, as determined by a first measurement, from the calibrated reference measurement 601'. Also, configuration wafer 405C is misaligned as indicated by an alignment offset of the center of the wafer 405C, as determined by a first measurement, from the calibrated reference measurement 601'. Configuration wafer 405D is also misaligned as indicated by an alignment offset of the center of the wafer 405D, as determined by a first measurement, from the calibrated reference measurement 601'.

Each of the first and second measurement pairs for configuration wafers 405A-405D in FIG. 6B define difference vectors within the reference coordinate system 660'. For example, for configuration wafer 405A, first and second measurements define the difference vector 620A, previously introduced in FIG. 6A. Similarly, difference vector 620B is defined for first and second measurements of configuration wafer 405B, difference vector 620C is defined for first and second measurements of configuration wafer 405C, and difference vector 620D is defined for first and second measurements of configuration wafer 405D. All the difference vectors 620A-620D intersect at the end point of the offset vector 625 at point 650', which may be a translation of the rotation axis 650 as offset due to process conditions. That is, for each difference vector beginning at its respective first measurement of a corresponding incoming calibration wafer, halving the magnitude also defines the end point of the offset vector 625. The start point of the offset vector 625 is defined by the calibrated reference measurement 601'.

For purposes of illustration, any incoming wafer at any point along a calibrated path that is aligned with the initial calibrated location 601 may be corrected by the condition correction which corresponds to the offset vector 625. For example, in FIG. 6A, the calibrated wafer 405 in state 409A that is perfectly aligned to the initial calibrated location 601 is not aligned to the rotation axis 650 that has moved due to process condition imposed on the process module 110 until after applying the condition correction (e.g., offset vector 625). In that manner, the incoming calibration wafer is now aligned with point 650' which is aligned with the rotation axis 650 in the process module 110. For incoming wafers misaligned with the reference calibrated measurement 601' and correspondingly the initial calibrated location 601, an alignment correction is also applied to bring the wafer into full alignment with the rotation axis of the rotation device, as will be described in FIG. 5C.

A discussion of the formula for determining a condition offset and its correction follows. Variable inputs are described, as follows:

$$X_1, Y_1 = \text{AWC measured offset \#1} \qquad (1)$$

$$X_2, Y_2 = \text{AWC measured offset \#2} \qquad (2)$$

Intermediate variables are described, as follows:

$$\Delta X_P, \Delta Y_P = \text{Pedestal offset change (with 180 degree rotation)} \qquad (3)$$

Desired outputs are described, as follows:

$$X_{P1}, Y_{P1} = \text{Offset on pedestal \#1} \qquad (4)$$

$$X_{P2}, Y_{P2} = \text{Offset on pedestal \#2} \qquad (5)$$

$$X_C, Y_C = \text{Robot Auto-calibration Correction Vector} \qquad (6)$$

Coordinate rotation matrix, 180 degrees (offset wafer rotating on pedestal) is described, as follows:

$$X_{P2} = X_{P1} * \cos(\theta) - Y_{P1} * \sin(\theta) \qquad (7)$$

$$Y_{P2} = X_{P1} * \sin(\theta) - Y_{P1} * \cos(\theta) \qquad (8)$$

When the angle of rotation ($\theta$) is 180 degrees, values are determined, as follows:

$$X_{P2} = -X_{P1} \qquad (9)$$

$$Y_{P2} = -Y_{P1} \qquad (10)$$

Therefore, the following is defined, as follows:

$$\Delta X_P = X_{P2} - X_{P1} = -X_{P1} - X_{P1} = -2X_{P1} \qquad (11)$$

$$\Delta Y_P = Y_{P2} - Y_{P1} = -Y_{P1} - Y_{P1} = -2Y_{P1} \qquad (12)$$

The AWC measurement reflects pedestal offset change as well, as follows:

$$\Delta X_P = X_2 - X_1 = 2X_{P1} \qquad (13)$$

$$\Delta Y_P = Y_2 - Y_1 = 2Y_{P1} \qquad (14)$$

$$X_{P1} = (\tfrac{1}{2})(X_2 - X_1) \qquad (15)$$

$$Y_{P1} = (\tfrac{1}{2})(Y_2 - Y_1) \qquad (16)$$

The desired robot auto-calibration correction vector is opposite the direction of the offset, as defined by the following:

$$X_C = -X_P = (\tfrac{1}{2})(X_1 - X_2) \qquad (17)$$

$$Y_C = -Y_{P1} = (\tfrac{1}{2})(Y_1 - Y_2) \qquad (18)$$

An example for calculating the offset correction vector and/or condition correction vector is provided in FIG. 4D.

FIG. 5C is a flow diagram 500C illustrating a method for determining an alignment offset of an incoming process wafer from the calibrated reference measurement, and applying an alignment correction based on the alignment offset and a condition correction based on an offset of a rotation axis of a rotation device within a process module to the incoming process wafer, in accordance with one embodiment of the present disclosure. Flow diagram 500C is performed during processing of wafers, and after calibration of the TM robot 132 as described in relation to FIG. 5A and the determination of the offset of the rotation axis of the rotation device as described in relation to FIG. 5B.

At 561, the method includes setting a condition for a process module for purposes of processing wafers. Previously, a reference coordinate system was established that is based on an initial calibrated location of a rotation axis of a rotation device within the process module (e.g., as described in relation to FIG. 5A and 510 of FIG. 5B). Also, a calibrated reference measurement (e.g., measurement 601' of a calibration wafer 405) is also established within the reference coordinate system 660 using a measurement device that is fixed within the reference coordinate system, as previously introduced in FIG. 5A. The calibrated reference measurement 601' is aligned with the initial calibrated location 601, as previously described.

At 565, the method includes picking up a process wafer 101 from an inbound load lock 170 using the TM robot. The process wafer is not the calibration wafer 405 in one embodiment, but a wafer designated to undergo processing of semiconductor devices and/or integrated circuits of semiconductor devices.

At 570, the method includes determining an alignment measurement of the process wafer within the reference coordinate system 660' using the measurement device when transferring the process wafer 101 to the process module 110. That is, the process wafer as picked up by the TM robot 132 may not be perfectly aligned to be placed centered with the initial calibrated location 601 corresponding to the center of the pedestal and rotation axis of the rotation device (e.g., lift pad). The alignment measurement determines the alignment offset of the incoming process wafer 101 as measured with the measuring device (e.g., AWC sensors 410) with respect to the calibrated reference measurement 601'.

Figure 7:
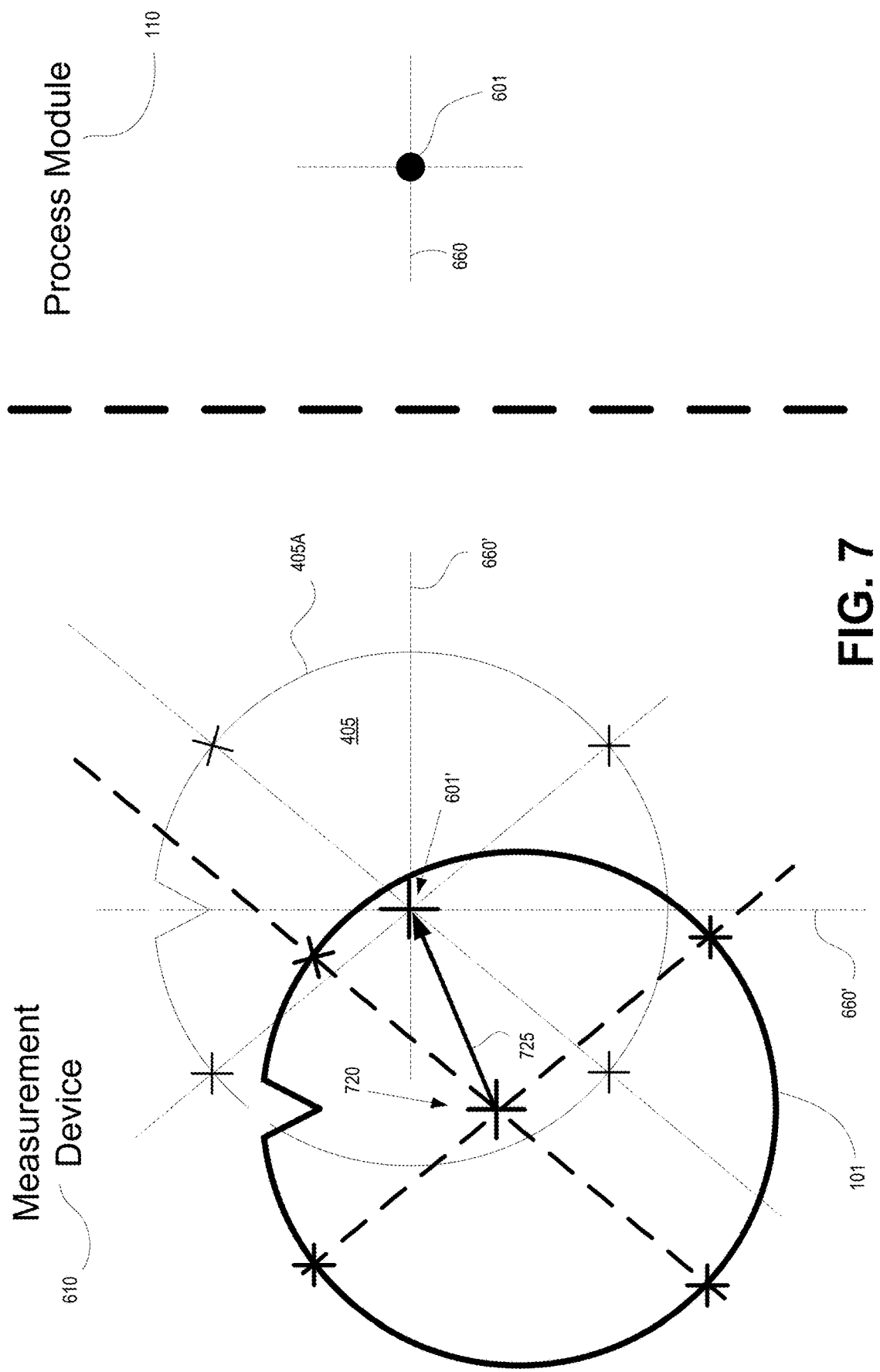
FIG. 7 is a diagram illustrating the alignment offset of an incoming process wafer from the calibrated reference measurement, in accordance with one embodiment of the present disclosure.

For example, FIG. 7 is a diagram illustrating the alignment offset of an incoming process wafer 101 from the calibrated reference measurement 601', in accordance with one embodiment of the present disclosure. As shown, the calibrated reference measurement 601' of a perfectly aligned calibration wafer 405, as measured by the measurement device within the reference coordinate system 660' and located outside of the process module 110, is aligned with the initial calibrated location 601 of the pedestal 140 and/or the rotation axis of the rotation device. In addition, process wafer 101 is shown misaligned with the calibrated reference measurement 601' by an alignment offset 725 (e.g., alignment offset vector). In particular, a first measurement (an alignment measurement) of the process wafer 101 is determined by the measurement device 610 that is fixed within the reference coordinate system 660'. The alignment measurement may be or be translated to the center 720 of the process wafer 101. As shown, the center 720 is misaligned from the calibrated reference measurement 601' by the alignment offset 725, which may be represented by a vector.

At 575, the method includes obtaining an alignment correction of the process wafer corresponding to an offset of the process wafer from the calibrated reference measurement based on the alignment measurement. In one embodiment, the alignment correction may be the alignment offset vector 725.

In addition, a condition correction of the rotation axis may be obtained at 576. The condition correction corresponds to an offset of the rotation axis from the initial calibrated location 601 when the process module is placed under a process condition. In particular, the offset of the rotation axis is determined before processing based on a rotation of a calibration wafer 405 by an angle about the rotation axis 650 using the rotation device within the process module that is under the process condition. The condition correction was previously described in relation to FIG. 5B.

In addition, at 580 the method includes applying the condition correction and the alignment correction to the incoming process wafer 101 to bring the wafer in alignment with the calibrated reference measurement 601' and correspondingly the initial calibrated location 601 of the rotation axis of the rotation device, as previously described. The alignment and condition corrections may be applied to the process wafer using the TM robot 132. Once both the condition correction and the alignment correction are applied, the incoming wafer 101 is aligned when placing the process wafer 101 in the process module 110 for processing at 590. That is, the incoming wafer 101 is now aligned to be placed to the rotation axis of the rotation device that has been offset from its initial calibrated location 601 (e.g., the center of the station and/or pedestal 140) within the process module 110 that is under a process condition.

Figure 8:
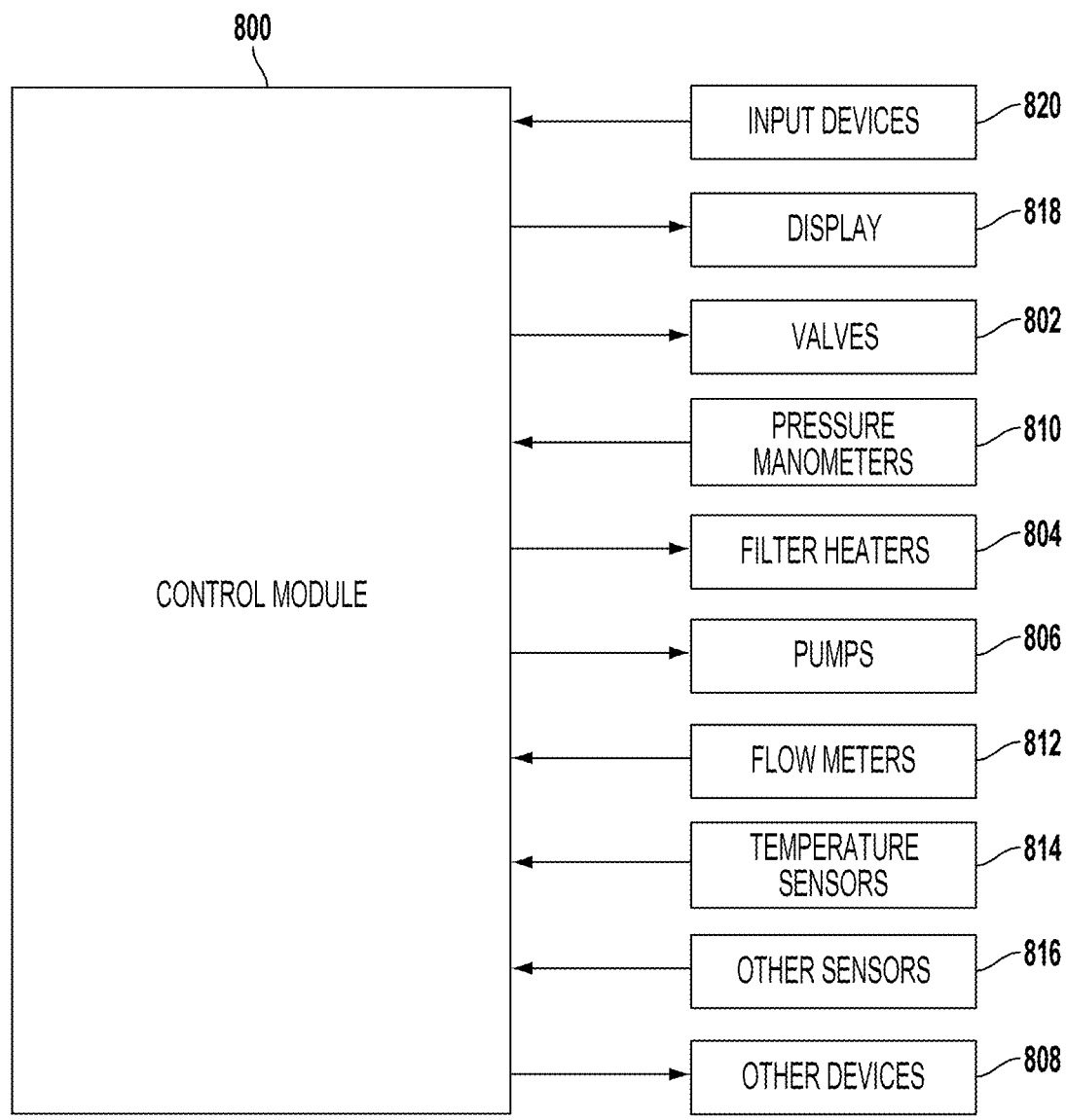
FIG. 8 shows a control module for controlling the systems described above.

FIG. 8 shows a control module 800 for controlling the systems described above. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g., a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 810, and thermocouples located in delivery system, the pedestal or chuck (e.g., the temperature sensors 814/220). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:
1. A system for processing wafers, comprising:
   a process module including a rotation device having a rotation axis;
   a pedestal within the process module configured for supporting a wafer;

a transfer module (TM) robot configured for transferring the wafer to and from the process module within a reference coordinate system; and a measurement system fixed within the reference coordinate system, the measurement system configured to determine an entry offset of the wafer within the reference coordinate system when transferring the wafer to the process module, the measurement system configured to determine an exit offset of the wafer when transferring the wafer from the process module and after the wafer has been rotated within the process module by the rotation device when the process module is under a process condition, the entry offset and the exit offset being based on an initial calibrated location of the pedestal in the process module, wherein the measurement system is configured for determining a condition induced offset of the rotation axis based on the entry offset and the exit offset.

2. The system of claim 1, wherein the condition induced offset corresponds to an offset of the rotation axis from the initial calibration location of the pedestal.

3. The system of claim 1, wherein the TM robot is configured for applying a condition correction based on the condition induced offset when transferring a plurality of wafers to and from the process module.

4. The system of claim 3,
wherein the measurement system is configured for determining an alignment offset of an incoming wafer based on the initial calibration location of the pedestal,
wherein the TM robot is configured for applying the condition correction and an alignment correction based on the alignment offset of the incoming wafer.

5. The system of claim 1, wherein the process condition includes at least one of a temperature level or a vacuum level.

6. The system of claim 1, wherein the measurement system includes two sensors configured for detecting the wafer.

7. The system of claim 1, wherein the rotation device is located on an end-effector.

8. The system of claim 1, wherein the rotation device is a lift pad configured to separate from the pedestal.

9. The system of claim 1, wherein the rotation device is the pedestal that is configured for rotation.

10. The system of claim 1, wherein the measurement system is located outside of the process module.

11. A method, comprising:
determining an entry offset of a wafer within a reference coordinate system when transferring the wafer to a pedestal of a process module, the entry offset being based on an initial calibrated location of the pedestal;
rotating the wafer within the process module using a rotation device;
determining an exit offset of the wafer within the reference coordinate system when transferring the wafer from the pedestal of the process module, the exit offset being based on the initial calibrated location of the pedestal; and
determining a condition induced offset of a rotation axis of the rotation device using the entry offset and the exit offset.

12. The method of claim 11, further comprising:
applying a process condition to the process module.

13. The method of claim 12,
wherein the process condition includes at least one of a temperature level or a vacuum level.

14. The method of claim 11, further comprising:
determining a condition correction for the condition induced offset present when the process module is under a process condition.

15. The method of claim 14, further comprising:
applying the condition correction to a robot when transferring a plurality of wafers to and from the pedestal.

16. The method of claim 11, further comprising:
teaching a robot to the initial calibrated location corresponding to a center of the pedestal when no condition is applied to the process module;
placing a calibration wafer centered to the pedestal;
removing the calibration wafer from the pedestal using the robot;
defining a calibrated reference measurement of the calibration wafer using a measurement device that is fixed within the reference coordinate system, the calibrated reference measurement being aligned with the initial calibrated location;
wherein the entry offset is measured from the calibrated reference measurement using the measurement device; and
wherein the exit offset is measured from the calibrated reference measurement using the measurement device.

17. The method of claim 16,
wherein the calibrated reference measurement, the entry offset, and the exit offset are located outside of the process module.

18. The method of claim 11,
wherein the rotation device is located on an end-effector.

19. The method of claim 11,
wherein the rotation device is a lift pad configured to separate from the pedestal.

20. The method of claim 11, wherein the determining the condition induced offset includes:
determining a difference vector between the entry offset and the exit offset; and
halving a magnitude of the difference vector to determine the condition induced offset of the rotation axis of the rotation device.

* * * * *